United States Patent
Miyazawa et al.

(10) Patent No.: US 9,397,014 B2
(45) Date of Patent: Jul. 19, 2016

(54) SEMICONDUCTOR DEVICE HAVING LATERALLY-EXTENDING ELECTRODE WITH REDUCED INDUCTANCE

(71) Applicant: Mitsubishi Electric Corporation, Tokyo (JP)

(72) Inventors: Masaomi Miyazawa, Tokyo (JP); Mituharu Tabata, Tokyo (JP); Takuya Takahashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/566,503

(22) Filed: Dec. 10, 2014

(65) Prior Publication Data
US 2015/0270186 A1    Sep. 24, 2015

(30) Foreign Application Priority Data
Mar. 20, 2014    (JP) .................................. 2014-058093

(51) Int. Cl.
| | |
|---|---|
| *H01L 23/02* | (2006.01) |
| *H01L 23/06* | (2006.01) |
| *H01L 23/34* | (2006.01) |
| *H01L 23/053* | (2006.01) |
| *H01L 23/16* | (2006.01) |
| *H01L 23/00* | (2006.01) |
| *H01L 25/07* | (2006.01) |

(52) U.S. Cl.
CPC .............. *H01L 23/053* (2013.01); *H01L 23/16* (2013.01); *H01L 24/36* (2013.01); *H01L 24/40* (2013.01); *H01L 25/072* (2013.01); *H01L 2224/40137* (2013.01); *H01L 2924/16151* (2013.01); *H01L 2924/16195* (2013.01); *H01L 2924/3025* (2013.01); *H01L 2924/30107* (2013.01)

(58) Field of Classification Search
CPC .................. H01L 23/053; H01L 23/16; H01L 2924/01079; H01L 2224/48091; H01L 2924/01013; H01L 2924/01029
USPC .......................... 257/678, 680, 684, 712, 719
See application file for complete search history.

(56) References Cited

U.S. PATENT DOCUMENTS

| | | | | |
|---|---|---|---|---|
| 5,273,440 A | * | 12/1993 | Ashman ................. | H01R 12/62 439/67 |
| 2006/0244111 A1 | * | 11/2006 | Kuwahara ............ | H01R 43/007 257/668 |

FOREIGN PATENT DOCUMENTS

JP    2009-004435 A    1/2009

* cited by examiner

*Primary Examiner* — A. Sefer
*Assistant Examiner* — Dilinh Nguyen
(74) *Attorney, Agent, or Firm* — Studebaker & Brackett PC

(57) ABSTRACT

An electrode includes an extending portion extending such that both ends thereof get into a first recessed portion and a second recessed portion provided in a first inner wall and a second inner wall, respectively, facing each other in a lateral direction of a case. The extent to which both the ends of the extending portion get into is set such that positions of both the ends thereof in a case where both the ends are narrowed toward a midpoint therebetween to reduce a length of the extending portion to 70% of the length of the extending portion exist between positions of the first and second inner walls in a case where the first and second inner walls are each narrowed toward a midpoint therebetween by 10% of the distance between the first and second inner walls.

26 Claims, 17 Drawing Sheets

F I G. 1 0
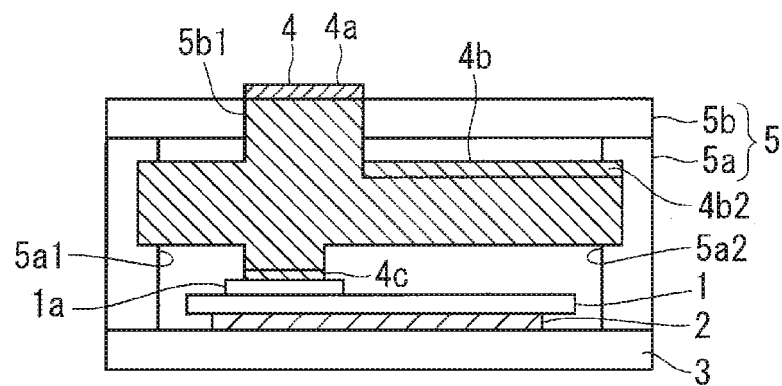
F I G. 1 1
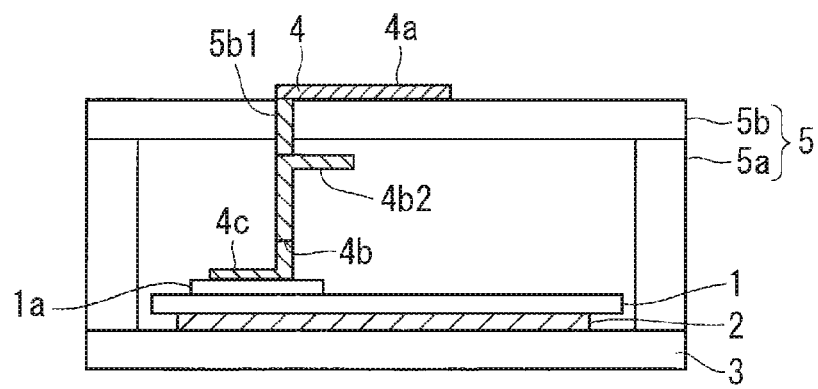

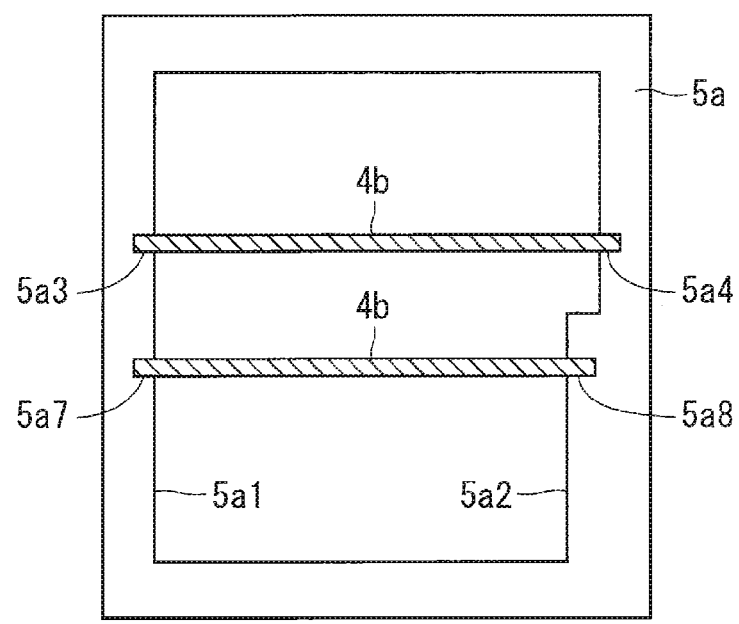
F I G. 3 1

SEMICONDUCTOR DEVICE HAVING LATERALLY-EXTENDING ELECTRODE WITH REDUCED INDUCTANCE

BACKGROUND OF THE INVENTION

1. Field of the Invention

The present invention relates to a semiconductor device and more particularly to a semiconductor device including an electrode extending in a lateral direction of a case.

2. Description of the Background Art

A semiconductor device that includes a substrate on which a semiconductor element is mounted, an electrode electrically connected to the semiconductor element, and a case covering the substrate and the electrode is known. In such semiconductor device, the electrode is usually connected to a circuit pattern of the substrate near a side wall of the case and drawn from the side wall to the outside of the case (for example, Japanese Patent Application Laid-Open No. 2009-004435). This configuration can shorten the electrode, and thus its inductance can be reduced.

The above-mentioned semiconductor device is required to easily modify a drawn position of the electrode in the case or a position of a connection point between the electrode and the circuit pattern by modifying the design.

However, if the drawn position of the electrode in the case is modified with the length of the electrode kept as short as possible, the position of the connection point between the electrode and the circuit pattern also requires a modification. This requires extreme work such that the circuit pattern needs a redesign. On the other hand, if the drawn position of the electrode in the case is modified without modifying the position of the connection point between the circuit pattern and the electrode, the length of the electrode is increased by the length of the electrode being drawn around and the inductance is thus increased. The case of modifying the position of the connection point also has the same problem as the case of modifying the drawn position.

SUMMARY OF THE INVENTION

The present invention has been made in view of the above-mentioned problems, and an object thereof is to provide a technique capable of easily modifying a drawn position of an electrode or a connection point of an electrode by a simple design modification while an inductance of the electrode is reduced.

A semiconductor device of the present invention includes a substrate on which a semiconductor element is mounted, an electrode that is electrically connected to the semiconductor element, and a case that covers the substrate and a remaining portion except for an upper portion of the electrode. The remaining portion of the electrode includes an extending portion extending such that both ends thereof get into a first recessed portion and a second recessed portion provided in a first inner wall and a second inner wall, respectively, facing each other in a lateral direction of the case. The extent to which both the ends of the extending portion get into is set such that positions of both the ends thereof in a case where both the ends are narrowed toward a midpoint therebetween to reduce a length of the extending portion to 70% of the length of the extending portion exist between positions of the first and second inner walls in a case where the first and second inner walls are each narrowed toward a midpoint therebetween by 10% of the distance between the first and second inner walls.

The drawn position of the electrode or the connection point of the electrode can be modified by the simple design modification while the inductance of the electrode is reduced.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 10 and 11 are cross-sectional views showing a configuration of a power module according to a seventh preferred embodiment;

FIG. 31 is a cross-sectional view showing a configuration of a power module according to a twenty-third preferred embodiment.

DESCRIPTION OF THE PREFERRED EMBODIMENTS

First Preferred Embodiment

Figure 1:
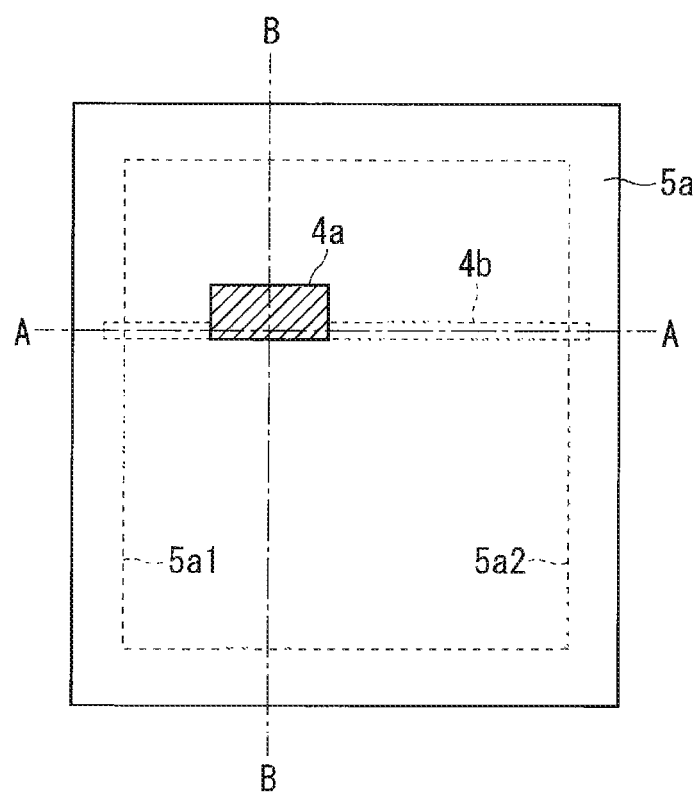
FIG. 1 is a plan view showing a configuration of a power module according to a first preferred embodiment.
Figure 2:
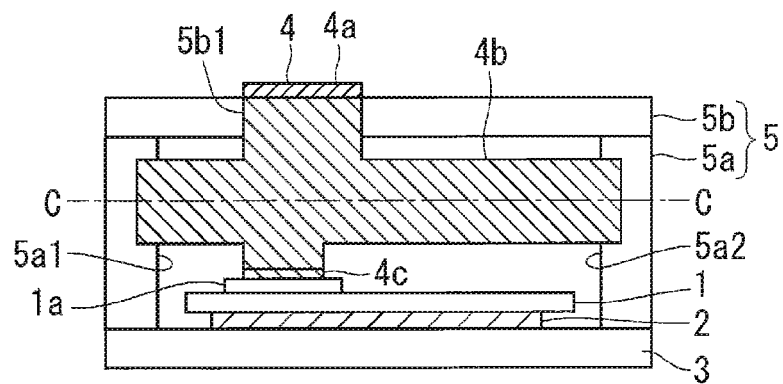
FIGS. 2 to 4 are cross-sectional views showing the configuration of the power module according to the first preferred embodiment.
Figure 3:
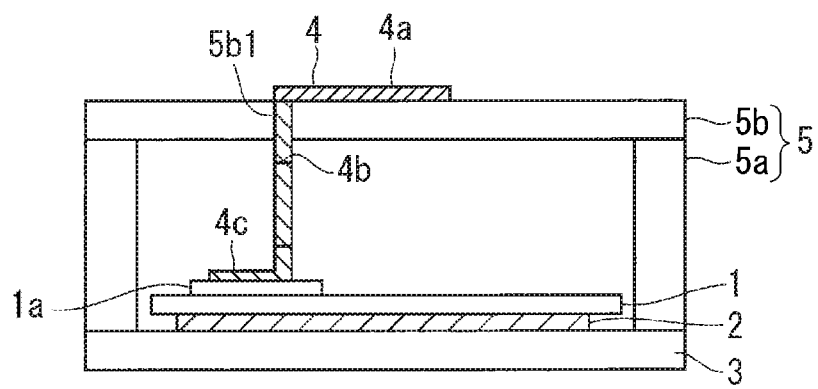
Figure 4:
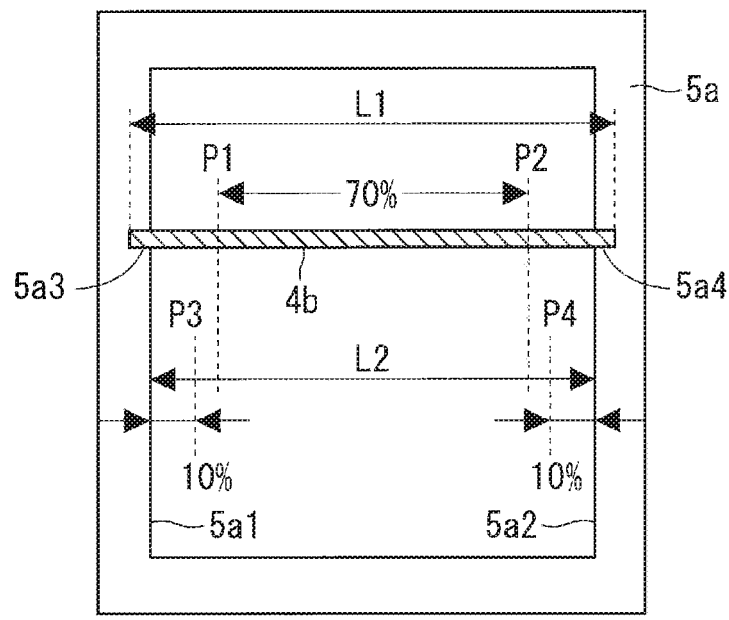

FIG. 1 is a plan view showing a configuration of a power module according to a first preferred embodiment of the present invention to which a semiconductor device is applied, FIG. 2 is a cross-sectional view taken along an A-A line of FIG. 1, and FIG. 3 is a cross-sectional view taken along a B-B line of FIG. 1. FIG. 4 is a cross-sectional view taken along a C-C line of FIG. 2.

The power module according to the first preferred embodiment includes an insulating substrate 1, a metal foil 2, a base plate 3, an electrode 4, and a case 5.

As shown in FIGS. 2 and 3, a semiconductor element 1a is mounted on the substrate 1. Herein, a circuit pattern which is not shown is provided on an upper surface of the substrate 1, and the circuit pattern is connected to the semiconductor element 1a.

The metal foil 2 and the base plate 3 are formed in the stated order on a surface of the substrate 1 opposite to the surface on which the semiconductor element 1a is mounted. The base plate 3 has the function of suppressing a mechanical deformation of the substrate 1. The insulating substrate 1 has the function of insulating the semiconductor element 1a and the circuit pattern from the metal foil 2.

The electrode 4 is indirectly connected to the semiconductor element 1a through the circuit pattern to be electrically connected to the semiconductor element 1a. However, this is not restrictive, and the electrode 4 may be directly connected to the semiconductor element 1a to be electrically connected to the semiconductor element 1a.

A terminal 4a is formed on an upper portion of the electrode 4. A remaining portion of the electrode 4 except for the upper portion thereof includes an extending portion 4b and a bottom portion 4c. Herein, a material for the electrode 4 is assumed to be a copper. The extending portion 4b and the bottom portion 4c will be described later in detail.

The case 5 includes a surrounding wall portion 5a and a cover portion 5b.

As shown in FIG. 4, the surrounding wall portion 5a has a first inner wall 5a1 and a second inner wall 5a2. Herein, the surrounding wall portion 5a is formed of four wall portions constituting four sides of a rectangle in a plan view. Among the walls, a pair of inner walls facing each other are the first inner wall 5a1 and the second inner wall 5a2. A lower portion of the surrounding wall portion 5a is connected to an upper portion of an outer periphery of the base plate 3.

A first recessed portion 5a3 is provided in the first inner wall 5a1, and a second recessed portion 5a4 is provided in the second inner wall 5a2.

Next, the extending portion 4b and the bottom portion 4c of the electrode 4 will be described before a description of a cover portion 5b. As shown in FIG. 4, the extending portion 4b extends such that both ends thereof get into the first recessed portion 5a3 and the second recessed portion 5a4 of the first inner wall 5a1 and the second inner wall 5a2 facing each other in a lateral direction of the case 5.

In the first preferred embodiment, both the ends of the extending portion 4b closely fit into the first recessed portion 5a3 and the second recessed portion 5a4 to be fixed to the first inner wall 5a1 and the second inner wall 5a2. This configuration can maintain flexibility of the extending portion 4b and relieve stress generated in the extending portion 4b. Moreover, it is expected that the configuration makes it easier to install the additional electrode 4 or simplifies the structure of the electrode 4. Furthermore, even if the material for the electrode 4 is a flexible material such as an annealed copper, the configuration can make misalignment of a bonding position bonded to the substrate 1 hard to occur.

As shown in FIG. 3, the extending portion 4b has a plate shape and extends also in a height direction. For example, when the case 5 is filled with a filling material which will be described later, this configuration can make it easier to let an air bubble out of the filling material. This can reduce the air bubble which is an obstacle in a visual inspection, so that the visual inspection can be easily performed.

In the first preferred embodiment, the extending portion 4b is integrally formed with the portion except for the extending portion 4b of the electrode 4 by one component. In other words, the extending portion 4b is continuously formed with the other portion of the electrode 4.

The bottom portion 4c is a portion formed by bending the lower portion of the electrode 4 and is electrically connected to the semiconductor element 1a. The bottom portion 4c (electrode 4) is connected to the circuit pattern on the substrate 1 bonded to the semiconductor element 1a by ultrasonic metal bonding. In the first preferred embodiment, the flexibility of the extending portion 4b is maintained as described above, and thus vibration generated at the time of bonding the electrode 4 to the circuit pattern by the ultrasonic metal bonding can be directed to the extending portion 4b. Therefore, the ultrasonic metal bonding can be efficiently performed.

Next, the cover portion 5b of the case 5 will be described. The cover portion 5b is removable from the upper portion of the surrounding wall portion 5a (for example, FIG. 17). As shown in FIGS. 2 and 3, when the cover portion 5b is mounted onto the surrounding wall portion 5a, the surrounding wall portion 5a and the cover portion 5b cover the substrate 1 and the remaining portions (the extending portion 4b and bottom portion 4c) of the electrode 4 except for the upper portion (terminal 4a). In other words, the cover portion 5b in collaboration with the surrounding wall portion 5a covers the extending portion 4b and bottom portion 4c of the electrode 4 and the substrate 1.

On the other hand, as shown in FIG. 2, the cover portion 5b does not cover the upper portion (terminal 4a) of the electrode 4, and the cover portion 5b has a hole 5b1 in which the upper portion of the electrode 4 fits without a gap when the cover portion 5b is mounted onto the surrounding wall portion 5a. FIG. 1 shows that only the terminal 4a is exposed from the cover portion 5b, and it shows the extending portion 4b, the first inner wall 5a1, and the second inner wall 5a2 with the hidden lines (dotted lines) because they are covered with the cover portion 5b.

In the first preferred embodiment, the electrode 4 is configured to include the extending portion 4b as described above. Thus, the position of the terminal 4a (drawn position of the electrode 4 in the case 5) or the position of the bottom portion 4c (position of the connection point between the electrode 4 and the circuit pattern) can be modified to an arbitrary portion on the extending portion 4b by modifying the designs of the terminal 4a and the hole 5b1. Consequently, while the inductance of the electrode 4 is reduced, the position of the terminal 4a (drawn position of the electrode 4 in the case 5) or the position of the bottom portion 4c (position of the connection point between the electrode 4 and the circuit pattern) can be easily modified.

However, if the extending portion 4b enters too far into the first recessed portion 5a3 and the second recessed portion 5a4 of the first inner wall 5a1 and the second inner wall 5a2, stress is applied to the case 5 from both the ends of the extending portion 4b due to the difference in linear expansion between the material for the case 5 and the material for the extending portion 4b, whereby the case 5 may conceivably be broken. Particularly, the semiconductor element 1a of the power module generates a relatively great amount of heat upon operation, and the stress due to the difference in the linear expansion increases, whereby it is conceivable that the problems above easily occur.

To solve the problems, the power module according to the first preferred embodiment is configured as shown in FIG. 4.

FIG. 4 illustrates positions P1 and P2 of both the ends of the extending portion 4b in an extending direction in a case where both the ends thereof are equally narrowed toward the midpoint therebetween to reduce the length of the extending portion 4b to 70% of the length of the extending portion 4b. Furthermore, FIG. 4 illustrates positions P3 and P4 of the first inner wall 5a1 and the second inner wall 5a2 in a case where the first inner wall 5a1 and the second inner wall 5a2 are each narrowed toward the midpoint therebetween by 10% of the distance between the first inner wall 5a1 and the second inner wall 5a2.

In the first preferred embodiment, the extent to which both the ends of the extending portion 4b get into the first inner wall 5a1 and the second inner wall 5a2 is set such that the positions P1 and P2 exist between the positions P3 and P4. In this configuration, the case 5 does not fix most part of the electrode 4, so that breakage of the case 5 due to the difference in the linear expansion can be suppressed.

In summary, in the power module according to the first preferred embodiment, the electrode 4 is configured to include the extending portion 4b. Thus, while the inductance of the electrode 4 is reduced, the position of the terminal 4a (drawn position of the electrode 4 in the case 5) or the position of the bottom portion 4c (position of the connection point between the electrode 4 and the circuit pattern) can be modified by the simple design modification. Moreover, the extent to which both the ends of the extending portion 4b get into is set such that the positions P1 and P2 exist between the positions P3 and P4, so that the breakage of the case 5 due to the difference in the linear expansion can be suppressed.

In the first preferred embodiment, the inductance can be reduced as described above, and thus a material for the electrode 4 is not limited to copper. A material for the electrode 4 may include, for example, any of inexpensive aluminum having low conductivity, aluminum alloy, magnesium alloy, iron alloy (steel), and copper alloy. If the electrode 4 is configured in such manner, the cost of the power module can be reduced. Moreover, as described in a preferred embodiment later, only part of the electrode 4 may include any of aluminum, aluminum alloy, magnesium alloy, iron alloy (steel), and copper alloy, for example.

The descriptions above describe that the first inner wall 5a1 and the second inner wall 5a2 fix both the ends of the extending portion 4b. However, this is not restrictive, and the other inner walls (for example, adjacent inner walls) of the case 5 may fix the extending portion 4b.

In the descriptions above, the case 5 is formed of the surrounding wall portion 5a and the removable cover portion 5b. However, the case 5 of the first preferred embodiment is not limited to the configuration, and, for example, the surrounding wall portion 5a and the cover portion 5b may be integral to be unremovable.

Second Preferred Embodiment

Figure 5:
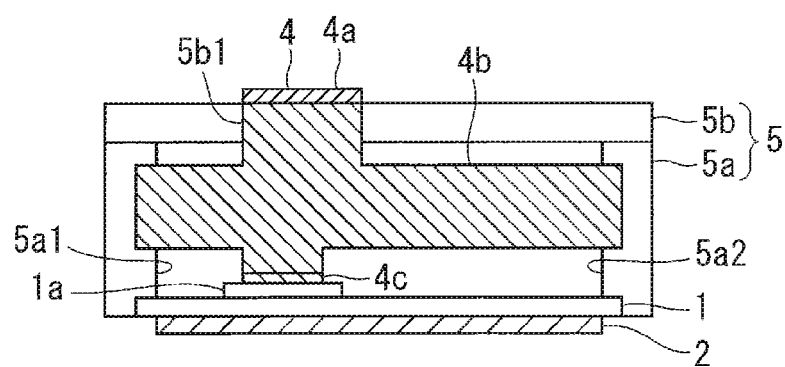
FIG. 5 is a cross-sectional view showing a configuration of a power module according to a second preferred embodiment.

FIG. 5 is a cross-sectional view showing a configuration of a power module according to a second preferred embodiment of the present invention similarly to FIG. 2. In the following descriptions of the power module, the same or similar components as those described above are denoted by the same references, and differences will be mainly described below.

In the second preferred embodiment, an outer periphery of the substrate 1 is fixed to an inner periphery of the case 5 (surrounding wall portion 5a). Herein, in the configuration in FIG. 5, even if stress which causes a center portion of the substrate 1 to project upwardly is generated, the electrode 4 functions as a beam supporting the upper surface of the center portion. Therefore, even if the metal foil 2 is configured to be exposed without the base plate 3, a mechanical deformation of the substrate 1 caused by the stress can be suppressed.

Third Preferred Embodiment

Figure 6:
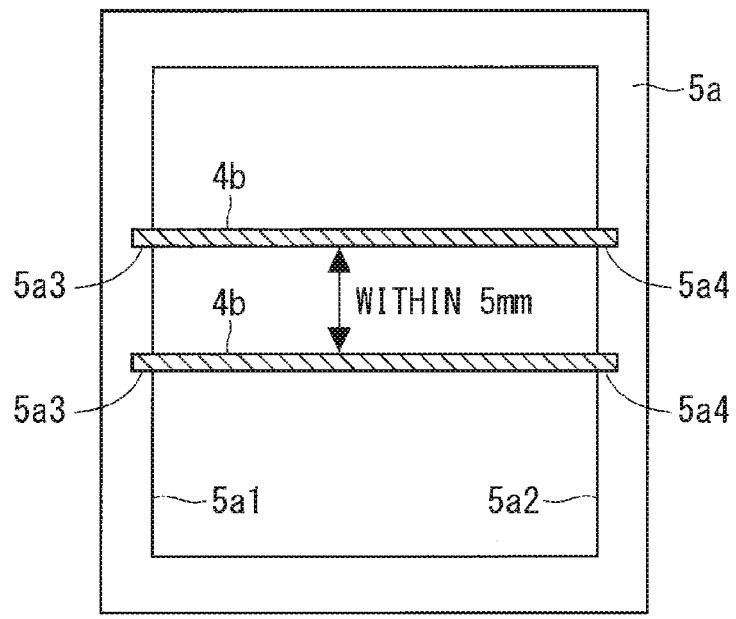
FIG. 6 is a cross-sectional view showing a configuration of a power module according to a third preferred embodiment.

FIG. 6 is a cross-sectional view showing a configuration of a power module according to a third preferred embodiment of the present invention similarly to FIG. 4. In the third preferred embodiment, the extending portions 4b of the plurality of electrodes 4 are disposed with an interval not greater than 5 mm therebetween. In addition, the plurality of electrodes 4 may be electrically connected to the one semiconductor element 1a or electrically connected to the plurality of semiconductor elements 1a. In this configuration, an alternating magnetic field generated by a passage of an AC current through one of the arbitrary electrodes 4 and an overcurrent on a surface of the other electrode 4 or an alternating magnetic field generated by the passage of an AC current through the other electrode 4 can cancel each other out (interfere with each other). As a result, a self-inductance can be reduced.

Fourth Preferred Embodiment

Figure 7:
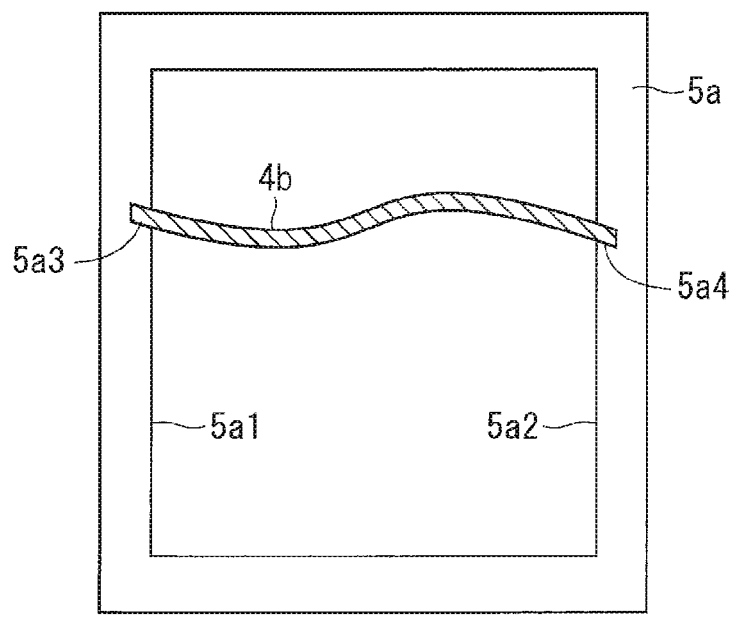
FIG. 7 is a cross-sectional view showing a configuration of a power module according to a fourth preferred embodiment.

FIG. 7 is a cross-sectional view showing a configuration of a power module according to a fourth preferred embodiment of the present invention similarly to FIG. 4. In the fourth preferred embodiment, the extending portion 4b of the electrode 4 has a curve shape as seen from a height direction. This configuration can easily relieve stress caused by thermal expansion (linear expansion) of the electrode 4 to the curved portion of the extending portion 4b, so that an influence of the stress can be suppressed. Moreover, the configuration can increase strength against the stress that curves the extending portion 4b as seen from an extending direction of the extending portion 4b of the electrode 4.

Fifth Preferred Embodiment

Figure 8:
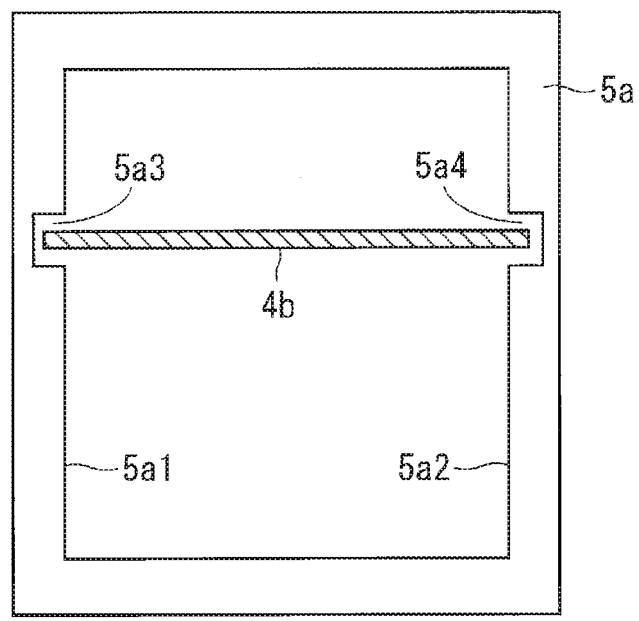
FIG. 8 is a cross-sectional view showing a configuration of a power module according to a fifth preferred embodiment.

FIG. 8 is a cross-sectional view showing a configuration of a power module according to a fifth preferred embodiment of the present invention similarly to FIG. 4. In the fifth preferred embodiment, both the ends of the extending portion 4b of the electrode 4 loosely fit into the first recessed portion 5a3 and the second recessed portion 5a4. This configuration can allow changes in dimension in an extending direction of the extending portion 4b caused by thermal expansion (linear expansion). This can easily relieve stress caused by the thermal expansion (linear expansion), so that an influence of the stress can be suppressed.

Sixth Preferred Embodiment

Figure 9:
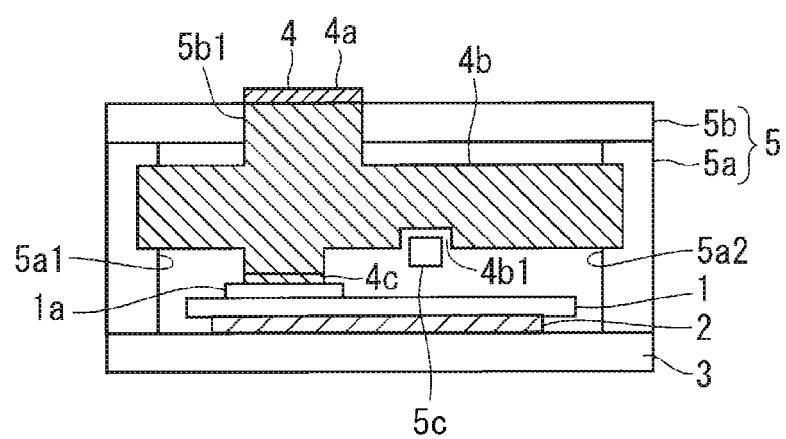
FIG. 9 is a cross-sectional view showing a configuration of a power module according to a sixth preferred embodiment.

FIG. 9 is a cross-sectional view showing a configuration of a power module according to a sixth preferred embodiment of the present invention similarly to FIG. 2. In the sixth preferred embodiment, at least one of an upper end and a lower end of the extending portion 4b of the electrode 4 lacks only a portion. In other words, the extending portion 4b has a lack 4b1 in only the portion. This configuration can achieve suppression of an inductance while keeping an area of the extending portion 4b as much as possible. Moreover, the configuration can also change a resonance time constant. Furthermore, a structure 5c that fits into (crosses) the lack 4b1 of the extending portion 4b is provided in the case 5, whereby an error can be identified upon the insertion of the electrode 4 into the case 5.

Seventh Preferred Embodiment

FIG. 10 is a cross-sectional view showing a configuration of a power module according to a seventh preferred embodiment of the present invention similarly to FIG. 2, and FIG. 11 is a cross-sectional view showing the configuration similarly to FIG. 3. In the seventh preferred embodiment, at least one of an upper end and a lower end of the extending portion 4b of the electrode 4 is bent perpendicularly to a height direction and an extending direction. In other words, a bent portion 4b2 is formed by bending at least one of the upper end and the lower end of the extending portion 4b. This configuration can increase strength against the stress that curves the extending portion 4b as seen from the height direction of the extending portion 4b of the electrode 4. Moreover, it is expected that the electrode 4 can be easily inserted into the case 5.

Eighth Preferred Embodiment

Figure 12:
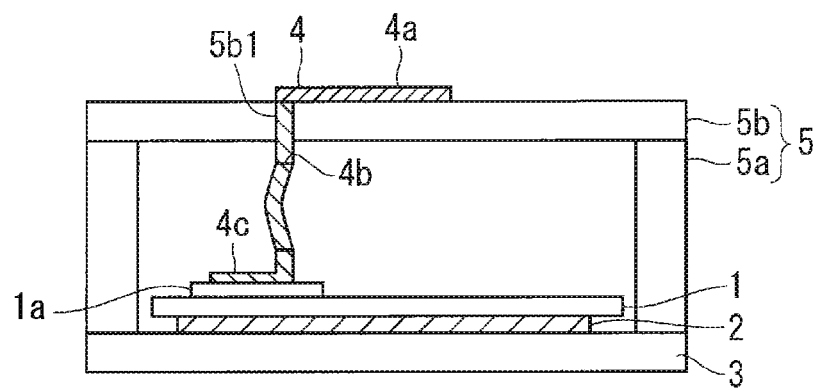
FIG. 12 is a cross-sectional view showing a configuration of a power module according to an eighth preferred embodiment.

FIG. 12 is a cross-sectional view showing a configuration of a power module according to an eighth preferred embodiment of the present invention similarly to FIG. 3. In the eighth preferred embodiment, the extending portion 4b of the electrode 4 has a curve shape as seen from an extending direction. This configuration can increase strength against the stress that curves the extending portion 4b as seen from a height direction of the extending portion 4b of the electrode 4. Moreover, the configuration can easily relieve the stress caused by thermal expansion (linear expansion) of the electrode 4 to the curved portion of the extending portion 4b, so that an influence of the stress can be suppressed.

Ninth Preferred Embodiment

Figure 13:
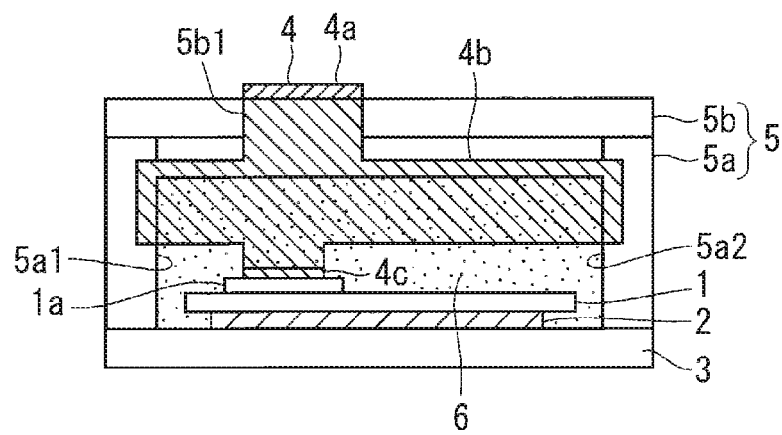
FIGS. 13 and 14 are cross-sectional views showing a configuration of a power module according to a ninth preferred embodiment.
Figure 14:
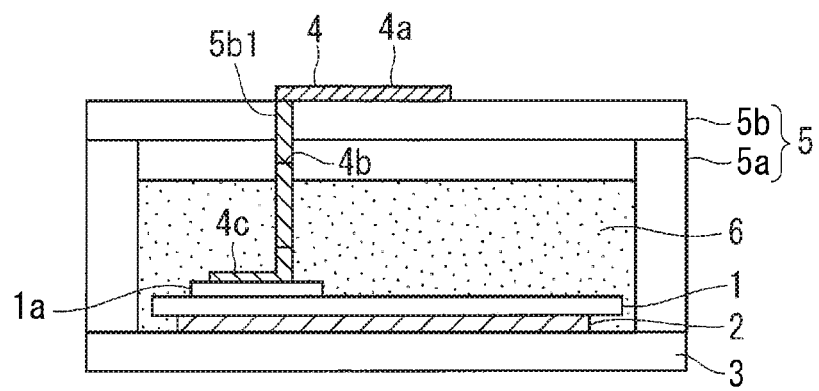

FIG. 13 is a cross-sectional view showing a configuration of a power module according to a ninth preferred embodiment of the present invention similarly to FIG. 2, and FIG. 14 is a cross-sectional view showing the configuration similarly to FIG. 3. The ninth preferred embodiment further includes an insulating filling material 6 filling the case 5. The extending portion 4b of the electrode 4 is buried in the filling material 6 for 50% or more of length of the extending portion 4b in a height direction. Even if the actual insulation distance between the electrode 4 and the other current-carrying component is short, this configuration can substantially increase the insulation distance. Moreover, the extending portion 4b of the electrode 4 can reduce vibration of the filling material 6.

Tenth Preferred Embodiment

Figure 15:
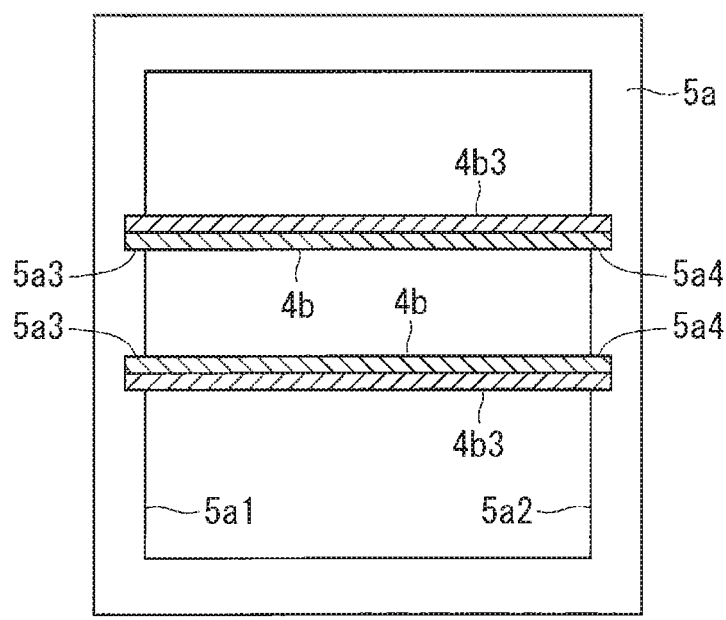
FIG. 15 is a cross-sectional view showing a configuration of a power module according to a tenth preferred embodiment.

FIG. 15 is a cross-sectional view showing a configuration of a power module according to a tenth preferred embodiment of the present invention similarly to FIG. 4. In the tenth preferred embodiment, at least one of the electrodes 4 is provided with a plating 4b3 that exposes a surface opposed to the other electrode 4 (hereinafter, referred to as a "facing surface"). In other words, the facing surface of each electrode 4 is not provided with the plating 4b3. A material for the plating 4b3 includes metal (such as nickel) having lower conductivity than that of the electrode 4.

When a high-frequency current is passed through the electrode 4, a current density of the surface of the electrode 4 increases due to a skin effect. Particularly, when a reverse current is passed through the two electrodes 4 facing each other, the current is passed through the surface of the facing surface of each electrode 4 easier than through the surface except for the facing surface. The configuration of the tenth preferred embodiment does not provide the plating 4b3 having low conductivity on the facing surface of each electrode 4, whereby the loss of the high-frequency current due to the resistance of the electrode 4 can be reduced.

Eleventh Preferred Embodiment

Figure 16:
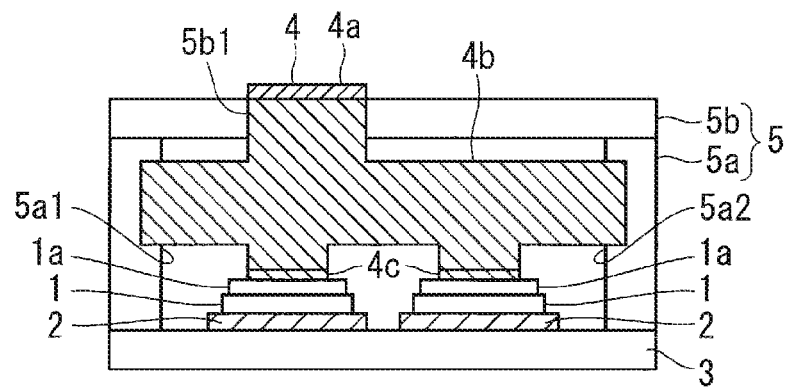
FIG. 16 is a cross-sectional view showing a configuration of a power module according to an eleventh preferred embodiment.

FIG. 16 is a cross-sectional view showing a configuration of a power module according to an eleventh preferred embodiment of the present invention similarly to FIG. 2. In the eleventh preferred embodiment, the one extending portion 4b of the one electrode 4 is electrically connected to each of a plurality of the semiconductor elements 1a. This configuration can combine the parallel connection of the plurality of semiconductor elements 1a (circuit patterns) with the extending portion 4b.

Twelfth Preferred Embodiment

Figure 17:
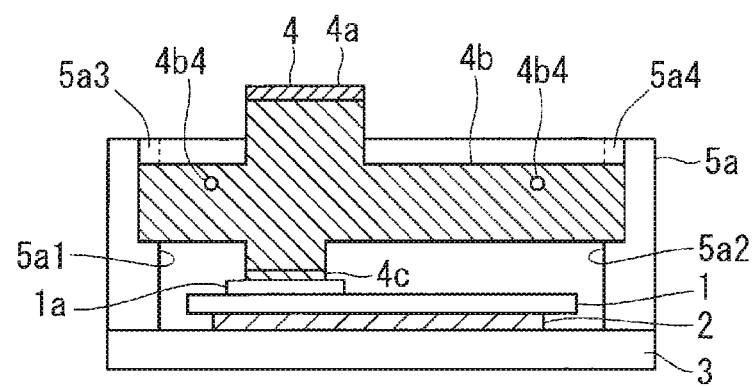
FIG. 17 is a cross-sectional view showing a configuration of a power module according to a twelfth preferred embodiment.

FIG. 17 is a cross-sectional view showing a configuration of a power module according to a twelfth preferred embodiment of the present invention similarly to FIG. 2. FIG. 17 illustrates a state where the cover portion 5b is removed from the surrounding wall portion 5a.

As shown in FIG. 17, the first recessed portion 5a3 provided in the first inner wall 5a1 has an opening on an upper side to allow the one end of the extending portion 4b to pass through the opening, and the second recessed portion 5a4 provided in the second inner wall 5a2 has an opening on an upper side to allow the other end of the extending portion 4b to pass through the opening. In a case where the cover portion 5b is removed from the surrounding wall portion 5a, the openings of the first recessed portion 5a3 and the second recessed portion 5a4 are exposed.

Holes 4b4 for tools to be inserted thereinto are provided in a portion except for both the ends of the extending portion 4b of the electrode 4 which are inserted into the first recessed portion 5a3 and the second recessed portion 5a4.

In the twelfth preferred embodiment, the tools are inserted into the holes 4b4 and pulled upward from the case 5 to slide the electrode 4 in the first recessed portion 5a3 and the second recessed portion 5a4, whereby the electrode 4 can be removed from the case 5. Thus, the electrode 4 can be removed from the case 5 without bending the electrode 4, so that damage of the electrode 4 can be suppressed.

Thirteenth Preferred Embodiment

Figure 18:
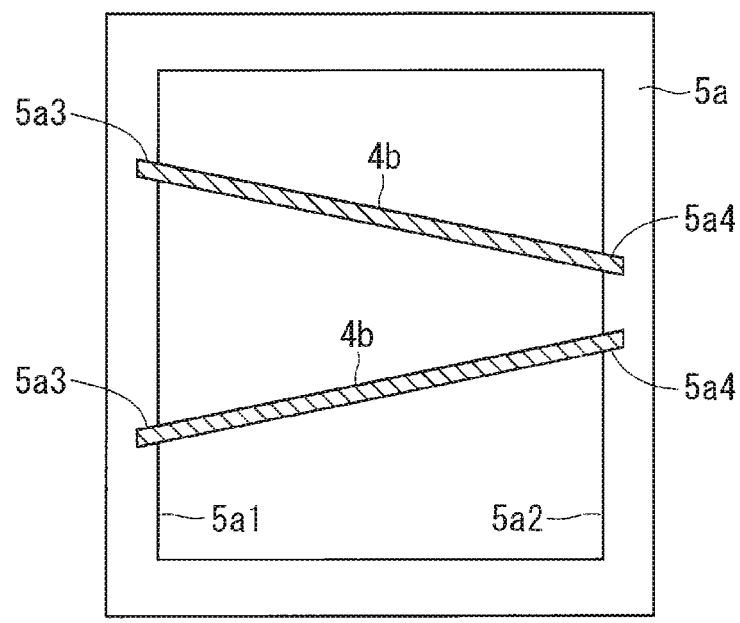
FIG. 18 is a cross-sectional view showing a configuration of a power module according to a thirteenth preferred embodiment.

FIG. 18 is a cross-sectional view showing a configuration of a power module according to a thirteenth preferred embodiment of the present invention similarly to FIG. 4. In the thirteenth preferred embodiment, the extending portion 4b of the first electrode 4 and the extending portion 4b of the second electrode 4 are different from each other in an extending direction. This configuration can increase strength of the case 5 after installation of the first electrode 4 and the second electrode 4 by a bracing effect by the first electrode 4 and the second electrode 4.

Fourteenth Preferred Embodiment

Figure 19:
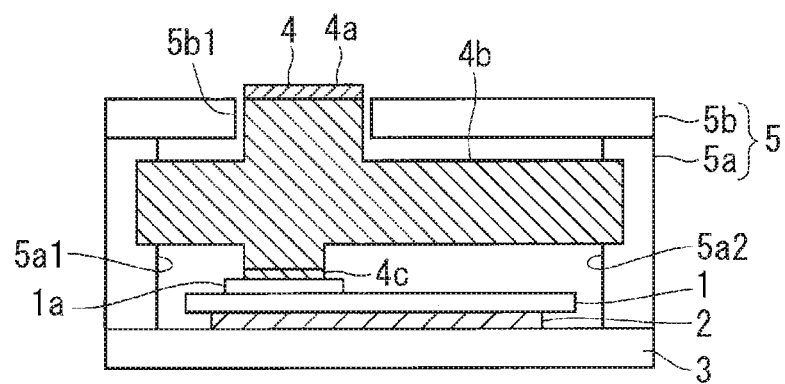
FIG. 19 is a cross-sectional view showing a configuration of a power module according to a fourteenth preferred embodiment.

FIG. 19 is a cross-sectional view showing a configuration of a power module according to a fourteenth preferred embodiment of the present invention similarly to FIG. 2. In the fourteenth preferred embodiment, the above-mentioned hole 5b1 of the cover portion 5b is provided as a hole in which the upper portion of the electrode 4 loosely fits in a case where the cover portion 5b is mounted onto the surrounding wall portion 5a. This configuration can relieve stress to some extent, the stress being applied to the electrode 4 according to a change in a position of external wiring.

Fifteenth Preferred Embodiment

Figure 20:
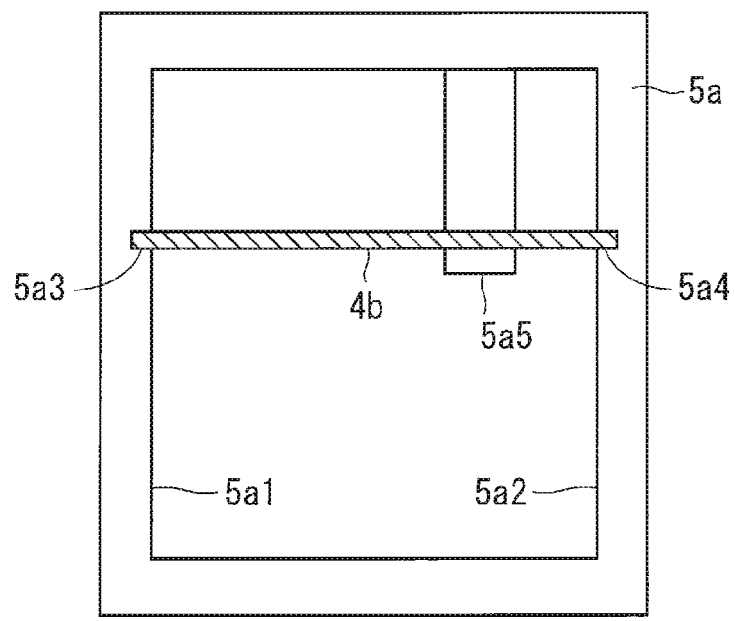
FIGS. 20 and 21 are cross-sectional views showing a configuration of a power module according to a fifteenth preferred embodiment.
Figure 21:
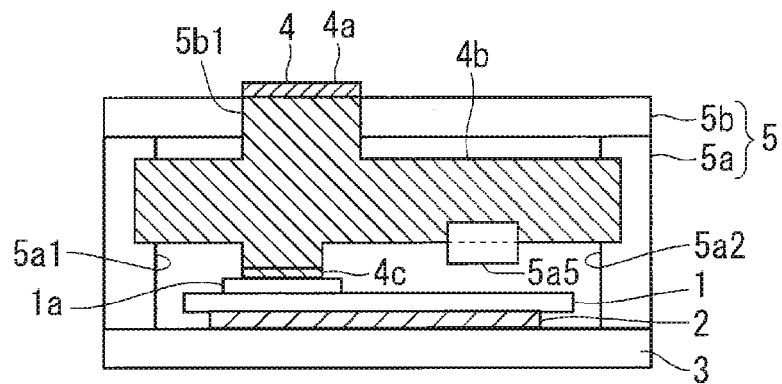

FIG. 20 is a cross-sectional view showing a configuration of a power module according to a fifteenth preferred embodiment of the present invention similarly to FIG. 4, and FIG. 21 is a cross-sectional view showing the configuration similarly to FIG. 2. In the fifteenth preferred embodiment, the case 5 includes an insulating fixing portion 5a5 that is provided to protrude from the inner wall except for the first inner wall 5a1 and the second inner wall 5a2. Here, the fixing portion 5a5 has a groove, and a lower end of the extending portion 4b of the electrode 4 fits in the groove to fix the extending portion 4b. Specifically, the fixing portion 5a5 is fitted with 20% or less of a region of the extending portion 4b except for both the ends inserted into the first recessed portion 5a3 and the second recessed portion 5a4, to thereby fix the extending portion 4b. This configuration can increase a position accuracy of the electrode 4.

Sixteenth Preferred Embodiment

Figure 22:
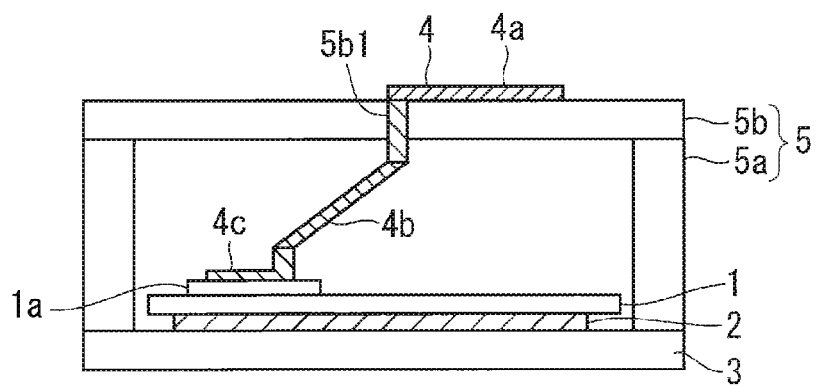
FIG. 22 is a cross-sectional view showing a configuration of a power module according to a sixteenth preferred embodiment.

FIG. 22 is a cross-sectional view showing a configuration of a power module according to a sixteenth preferred embodiment of the present invention similarly to FIG. 3. In the sixteenth preferred embodiment, the extending portion 4b of the electrode 4 is inclined to a height direction. This configuration can modify the position of the terminal 4a (drawn position of the electrode 4 in the case 5) in plan view to the portion except for the extending portion 4b. This causes a slight increase in the inductance of the electrode 4, but the position of the terminal 4a can be easily modified. Moreover, elasticity of the electrode 4 is easily deformed in the height direction, and thus flexibility of the height direction can be increased in the bonding between the substrate 1 and the electrode 4, which makes a correction easy. To increase the flexibility, the extending portion 4b of the electrode 4 is preferably configured not to be completely fixed in the height direction.

Seventeenth Preferred Embodiment

Figure 23:
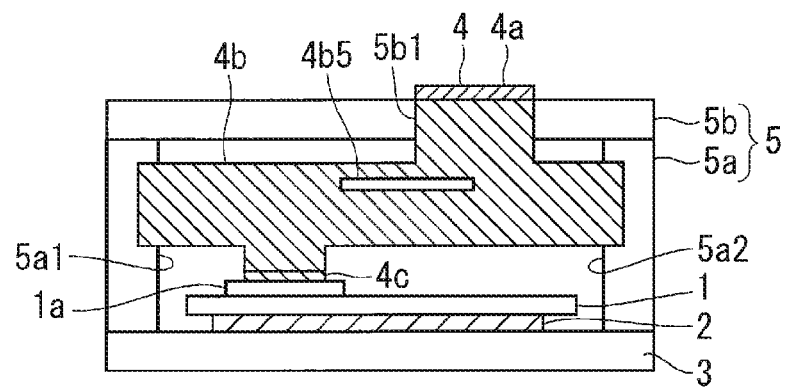
FIG. 23 is a cross-sectional view showing a configuration of a power module according to a seventeenth preferred embodiment.

FIG. 23 is a cross-sectional view showing a configuration of a power module according to a seventeenth preferred embodiment of the present invention similarly to FIG. 2. In the seventeenth preferred embodiment, the extending portion 4b of the electrode 4 is provided with a slit 4b5 whose long-side length is more than ten times short-side length. This configuration can control the energized state of the high-frequency current.

Eighteenth Preferred Embodiment

Figure 24:
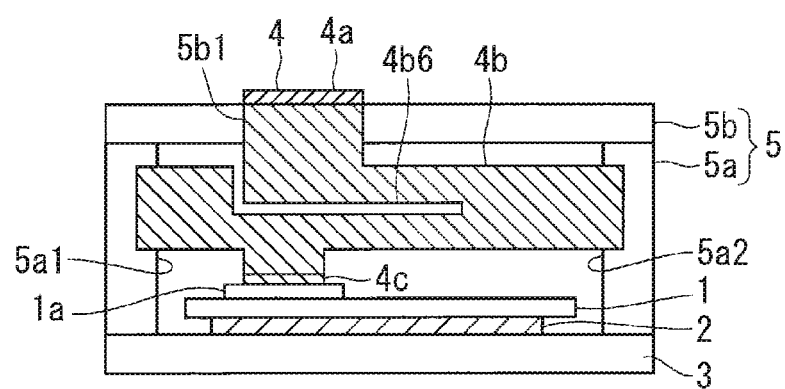
FIG. 24 is a cross-sectional view showing a configuration of a power module according to an eighteenth preferred embodiment.

FIG. 24 is a cross-sectional view showing a configuration of a power module according to an eighteenth preferred embodiment of the present invention similarly to FIG. 2. In the eighteenth preferred embodiment, the extending portion 4b of the electrode 4 is provided with a notch 4b6 whose long-side length is more than ten times short-side length. This configuration can control the energized state of the high-frequency current.

Nineteenth Preferred Embodiment

Figure 25:
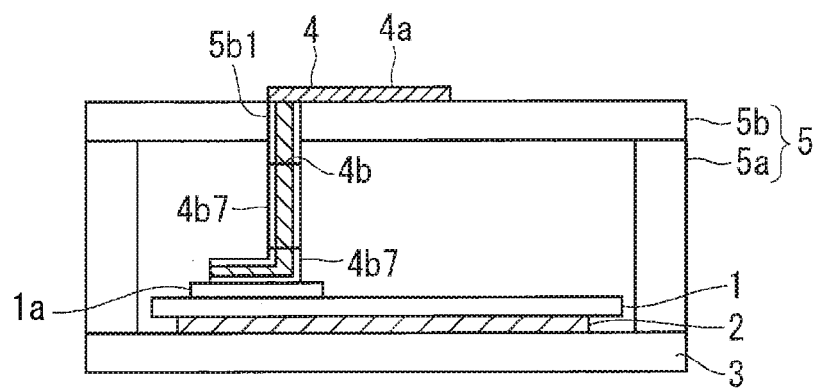
FIG. 25 is a cross-sectional view showing a configuration of a power module according to a nineteenth preferred embodiment.

FIG. 25 is a cross-sectional view showing a configuration of a power module according to a nineteenth preferred embodiment of the present invention similarly to FIG. 3. In the nineteenth preferred embodiment, a cladding member 4b7 is provided on a surface of the electrode 4. Here, a material for the electrode 4 includes, for example, copper, and a material for the cladding member 4b7 includes, for example, any of inexpensive aluminum having low conductivity, aluminum alloy, magnesium alloy, iron alloy (steel such as SUS), and copper alloy.

As described above, the configuration of the first preferred embodiment can reduce the inductance. Thus, even if the cladding member 4b7 is used for part of the electrode 4 as with the nineteenth preferred embodiment, the cost of the power module can be reduced while the low inductance is maintained. Particularly, if the SUS is used for the cladding member 4b7, the strength can be increased.

Twentieth Preferred Embodiment

In the power modules as described above, the extending portion 4b is integrally formed with the portion except for the extending portion 4b of the electrode 4 by one component. However, if the extending portion 4b is suitable for the purpose of a magnetic shield and fixing, the extending portion 4b and a remaining portion are not needed to be continuously formed by the one component as described below.

Figure 26:
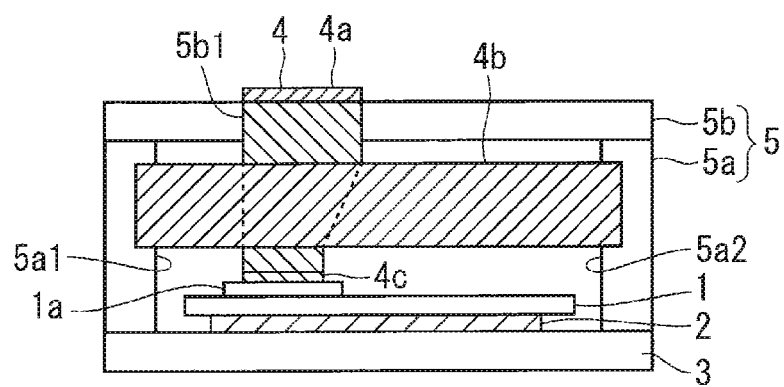
FIGS. 26 and 27 are cross-sectional views showing a configuration of a power module according to a twentieth preferred embodiment.
Figure 27:
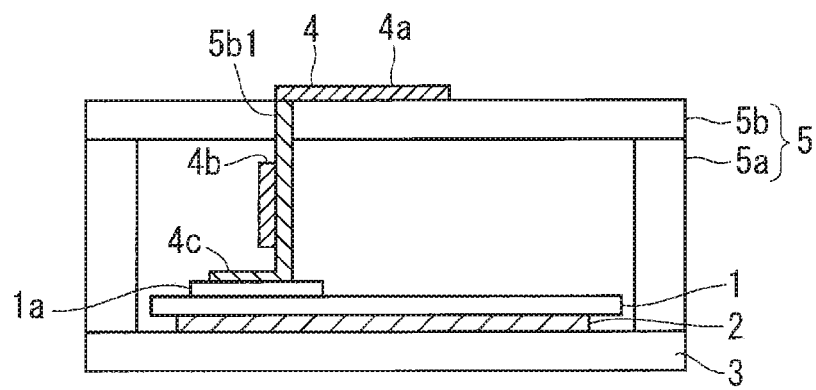

FIG. 26 is a cross-sectional view showing a configuration of a power module according to a twentieth preferred embodiment of the present invention similarly to FIG. 2, and FIG. 27 is a cross-sectional view showing the configuration similarly to FIG. 3. In the twentieth preferred embodiment, the extending portion 4b of the electrode 4 is bonded to the remaining portion except for the extending portion 4b of the electrode 4 to form the electrode 4. A material for the extending portion 4b of the electrode 4 includes any of aluminum, aluminum alloy, magnesium alloy, iron alloy, and copper alloy, and the remaining portion except for the extending portion 4b of the electrode 4 includes copper.

As with the twentieth preferred embodiment, if the extending portion 4b is bonded to the remaining portion to form the electrode 4, an inexpensive metal can be used and the cost of the power module can thus be reduced.

Twenty-First Preferred Embodiment

Figure 28:
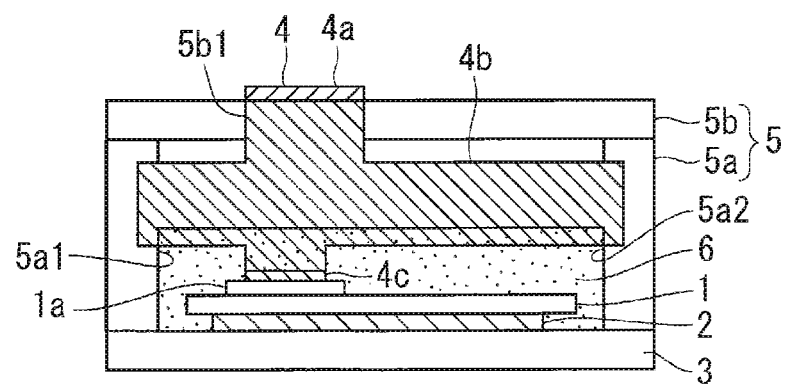
FIGS. 28 and 29 are cross-sectional views showing a configuration of a power module according to a twenty-first preferred embodiment.
Figure 29:
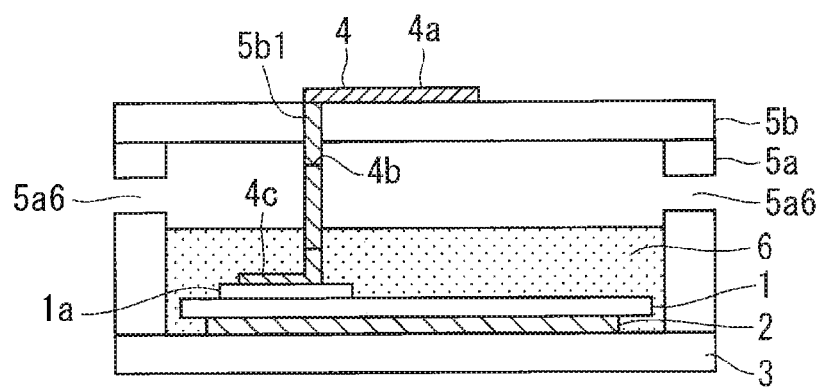

FIG. 28 is a cross-sectional view showing a configuration of a power module according to a twenty-first preferred embodiment of the present invention similarly to FIG. 2, and FIG. 29 is a cross-sectional view showing the configuration similarly to FIG. 3. In the twenty-first preferred embodiment, ventilating holes 5a6 are provided in the case 5. Specifically, the ventilating holes 5a6 are provided above the upper surface of the filling material 6 in the inner walls facing the main surfaces of the extending portion 4b of the electrode 4. This configuration can cool the extending portion 4b having a relatively great surface area, whereby the terminal 4a can be efficiently cooled.

Twenty-Second Preferred Embodiment

Figure 30:
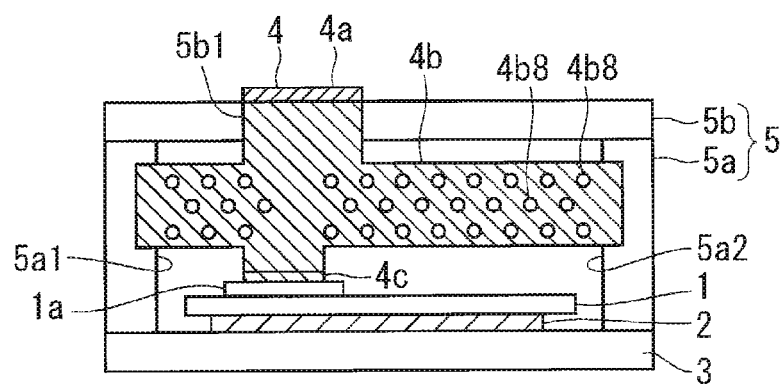
FIG. 30 is a cross-sectional view showing a configuration of a power module according to a twenty-second preferred embodiment.

FIG. 30 is a cross-sectional view showing a configuration of a power module according to a twenty-second preferred embodiment of the present invention similarly to FIG. 2. In the twenty-second preferred embodiment, a plurality of holes 4b8 are provided in the extending portion 4b of the electrode 4. This configuration can achieve the weight reduction of the power module and can also increase the cooling efficiency in the extending portion 4b. In addition, FIG. 30 illustrates the case where the plurality of holes 4b8 are punched holes, but this is not restrictive and the holes may be formed by meshes of the extending portion 4b, for example.

Twenty-Third Preferred Embodiment

FIG. 31 is a cross-sectional view showing a configuration of a power module according to a twenty-third preferred embodiment of the present invention similarly to FIG. 4. In the twenty-third preferred embodiment, the extending portions 4b included in the electrodes 4 have the different lengths in the extending direction. The two (plurality) of first recessed portions 5a3 and 5a7 are provided in the first inner wall 5a1, and the two (plurality) of second recessed portions 5a4 and 5a8 in pairs with the first recessed portions 5a3 and 5a7, respectively, are provided in the second inner wall 5a2. A distance between the first recessed portion 5a3 and the second recessed portion 5a4 in one pair corresponds to the length of the one extending portion 4b in the extending direction. A distance between the first recessed portion 5a7 and the second recessed portion 5a8 in another pair corresponds to the length of another extending portion 4b in the extending direction. In other words, the distance between the first recessed portions and the second recessed portions of each of the pairs corresponds to the length of each of the extending portions 4b in the extending direction. This configuration can suppress an error when the electrodes 4 are inserted into the case 5.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a substrate on which a semiconductor element is mounted;
an electrode that is electrically connected to said semiconductor element; and
a case that covers said substrate and a remaining portion except for an upper portion of said electrode, wherein
said remaining portion of said electrode includes an extending portion extending such that both ends thereof get into a first recessed portion and a second recessed portion provided in a first inner wall and a second inner wall, respectively, facing each other in a lateral direction of said case, and
the extent to which said both ends of said extending portion get into is set such that positions of said both ends thereof in a case where said both ends are narrowed toward a midpoint therebetween to reduce a length of said extending portion to 70% of the length of said extending portion exist between positions of said first and second inner walls in a case where said first and second inner walls are each narrowed toward a midpoint therebetween by 10% of the distance between said first and second inner walls.

2. The semiconductor device according to claim 1, wherein said both ends of said extending portion fit into said first and second recessed portions of said first and second inner walls, respectively, to be fixed to said first and second inner walls.

3. The semiconductor device according to claim 2, wherein said electrode is bonded to a circuit pattern on said substrate connected to said semiconductor element by ultrasonic metal bonding.

4. The semiconductor device according to claim 1, wherein said extending portion has a plate shape and extends also in a height direction.

5. The semiconductor device according to claim 4, wherein at least one of an upper end and a lower end of said extending portion is bent perpendicularly to the height direction and an extending direction of said extending portion.

6. The semiconductor device according to claim 4, wherein said extending portion has a curve shape as seen from an extending direction of said extending portion.

7. The semiconductor device according to claim 4, wherein said extending portion is inclined to the height direction.

8. The semiconductor device according to claim 1, wherein an outer periphery of said substrate is fixed to an inner periphery of said case.

9. The semiconductor device according to claim 1, wherein a plurality of said extending portions of a plurality of said electrodes are disposed with an interval not greater than 5 mm therebetween.

10. The semiconductor device according to claim 9, wherein at least one of said electrodes is provided with a plating that exposes a surface opposed to other said electrode.

11. The semiconductor device according to claim 9, wherein said extending portion of said first electrode and said extending portion of said second electrode are different from each other in an extending direction.

12. The semiconductor device according to claim 9, wherein
said extending portions included in said electrodes have different lengths in an extending direction,
a plurality of pairs of said first recessed portions and said second recessed portions are provided in said first inner wall and said second inner wall, and
a distance between said first recessed portions and said second recessed portions of each of said pairs corresponds to the length of each of said extending portions in said extending direction.

13. The semiconductor device according to claim 1, wherein said extending portion has a curve shape as seen from a height direction.

14. The semiconductor device according to claim 1, wherein said both ends of said extending portion loosely fit into said first and second recessed portions.

15. The semiconductor device according to claim 1, wherein at least one of an upper end and a lower end of said extending portion lacks a portion.

16. The semiconductor device according to claim 1, further comprising an insulating filling material that fills said case, said extending portion being buried in said filling material for 50% or more of length of said extending portion in a height direction.

17. The semiconductor device according to claim 1, wherein said one extending portion is electrically connected to each of a plurality of said semiconductor elements.

18. The semiconductor device according to claim 1, wherein
said first and second recessed portions have openings on an upper side thereof to allow said both ends of said extending portion to pass through said openings,
said case includes:
  a surrounding wall portion having said first and second inner walls; and
  a cover portion that is removable from an upper portion of said surrounding wall portion and covers said remaining portion and said substrate in collaboration with said surrounding wall portion,
in a case where said cover portion is removed from said surrounding wall portion, said openings of said first and second recessed portions are exposed, and
a portion except for said both ends of said extending portion has a hole for a tool to be inserted.

19. The semiconductor device according to claim 1, wherein
said case includes:
  a surrounding wall portion having said first and second inner walls; and
  a cover portion that is removable from an upper portion of said surrounding wall portion and covers said remaining portion and said substrate in collaboration with said surrounding wall portion, and
said cover portion has a hole in which said upper portion of said electrode loosely fits in a case where said cover portion is mounted onto said surrounding wall portion.

20. The semiconductor device according to claim 1, wherein
said case includes an insulating fixing portion provided to protrude from an inner wall except for said first and second inner walls, and
said fixing portion is fitted with 20% or less of a region of said extending portion except for said both ends to fix said extending portion.

21. The semiconductor device according to claim 1, wherein said extending portion is provided with a slit or a notch whose long-side length is more than ten times short-side length.

22. The semiconductor device according to claim 1, wherein a cladding member is provided on a surface of said electrode.

23. The semiconductor device according to claim 1, wherein a material for said electrode includes any of aluminum, aluminum alloy, magnesium alloy, iron alloy, and copper alloy.

24. The semiconductor device according to claim 1, wherein
said extending portion of said electrode is bonded to a remaining portion except for said extending portion of said electrode to form said electrode, and
a material for said extending portion of said electrode includes any of aluminum, aluminum alloy, magnesium alloy, iron alloy, and copper alloy.

25. The semiconductor device according to claim 1, wherein a ventilating hole is provided in said case.

26. The semiconductor device according to claim 1, wherein a plurality of holes are provided in said extending portion.

* * * * *